US005506441A

United States Patent [19]
Furuya

[11] Patent Number: 5,506,441
[45] Date of Patent: Apr. 9, 1996

[54] SEMICONDUCTOR DEVICE HAVING PAIR OF TRANSISTORS

[75] Inventor: Misao Furuya, Isehara, Japan

[73] Assignee: Mitsumi Electric Co., Ltd., Japan

[21] Appl. No.: 409,543

[22] Filed: Mar. 24, 1995

Related U.S. Application Data

[63] Continuation of Ser. No. 184,665, Jan. 21, 1994, abandoned.

[30] Foreign Application Priority Data

Jan. 25, 1993 [JP] Japan .................................. 5-010167

[51] Int. Cl.$^6$ .................................................. H01L 29/70
[52] U.S. Cl. ............................................ 257/566; 257/925
[58] Field of Search ..................................... 257/925, 566

[56] References Cited

U.S. PATENT DOCUMENTS 5,289,040 2/1994 Rogers ..................................... 257/666

FOREIGN PATENT DOCUMENTS 1665493A 12/1970 Germany ............................... 257/925

OTHER PUBLICATIONS

PTO, U.S. Govt., "Manual of Classification," Dec. 31, 1992. p. 257–15.

Primary Examiner—Jerome Jackson, Jr.
Assistant Examiner—John Guay
Attorney, Agent, or Firm—Andrus, Sceales, Starke & Sawall

[57] ABSTRACT

A semiconductor device includes a plurality of groups of transistor elements which are formed on a single semiconductor chip, each group having a first pair of transistor elements which are arranged so as to be symmetrical about a point and a second pair of transistor elements which are arranged, in a direction perpendicular to a direction in which the first pair of transistor elements are arranged, so as to be symmetrical about the point. The first pair of transistor elements in all the plurality of groups are connected in parallel so that a first transistor is formed of the first pair of transistor elements, and the second pair of transistor elements in all the plurality of groups are connected in parallel so that a second transistor is formed of the second pair of transistor elements, the first transistor and the second transistor being paired.

6 Claims, 6 Drawing Sheets

SEMICONDUCTOR DEVICE HAVING PAIR OF TRANSISTORS

The present application is a continuation application of U.S. patent application Ser. No. 08/184,665, filed Jan. 21, 1994, and now abandoned.

BACKGROUND OF THE INVENTION (1) Field of the Invention

The present invention generally relates to a semiconductor device, and more particularly to a semiconductor device having a pair of transistors which should have the same electrical characteristic, such as a differential amplifier.

(2) Description of the Related Art

Figure 1:
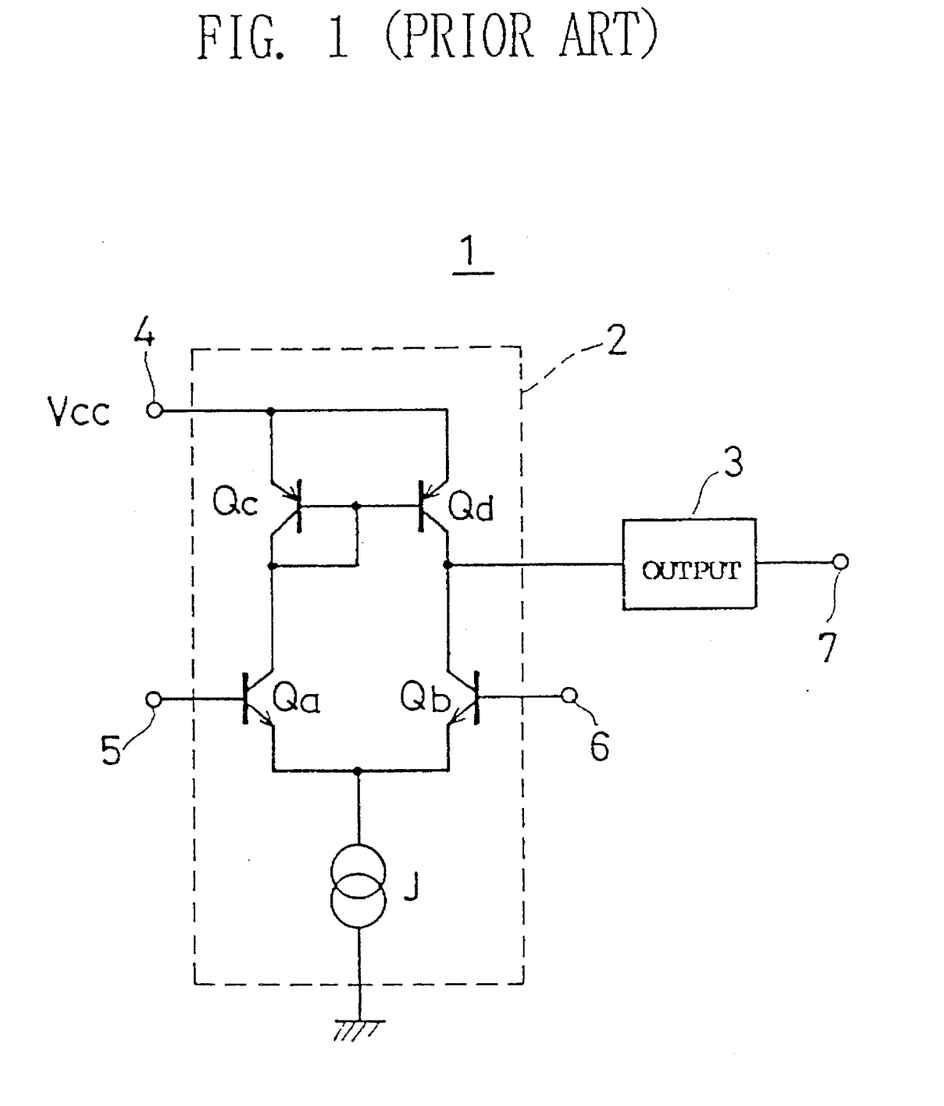
FIG. 1 is an equivalent circuit diagram illustrating a differential amplifier having a conventional pair of transistors.

FIG. 1 is an equivalent circuit diagram illustrating a conventional differential amplifier. Referring to FIG. 1, a differential amplifier 1 has an input stage 2 and an output stage 3. The input stage 2 comprises a first pair of transistors Qa and Qb, a second pair of transistors Qc and Qd and a constant-current source J. The transistors Qa and Qb are so-called differential pair transistors (differential input transistors). Emitters of the differential pair transistors Qa and Qb are connected to each other and the constant-current source J is connected to the emitters thereof. Collectors of the second pair of transistors Qc and Qd are respectively connected to collectors of the first pair of transistors Qa and Qb so that the second pair of transistors Qc and Qd function as a constant-current load of the differential pair transistors Qa and Qb. The second pair of transistors Qc and Qd form a current mirror circuit, and the transistors Qc and Qd are so-called current mirror transistors. Bases of the differential pair transistors Qa and Qb are connected to input terminals (an inverting input terminal and a non-inverting terminal) 5 and 6 between which signals are supplied. Emitters of the current mirror transistors Qc and Qd are connected to a power source terminal 4, and the output unit 3 is connected to the collectors of the transistors Qb and Qd so that a voltage in accordance with a voltage of a signal supplied between the input terminals 5 and 6 is output from an output terminal 7 thereof.

In the above differential amplifier, it is desired that no DC offset voltage be output from the output terminal 7 under a condition in which a voltage between the input terminals 5 and 6 (the bases of the differential pair transistors Qa and Qb) is equal to zero. The DC offset voltage depends on the difference between forward drop characteristics in base-emitter junctions of the differential pair transistors Qa and Qb. Thus, both the differential pair transistor Qa and Qb are generally made on a single semiconductor chip so as to have the same electrical characteristics (including the forward drop characteristics in the base-emitter junctions).

However, it is difficult to obtain differential pair transistors having exactly the same electrical characteristics. Due to the variations of plane shapes of elements of each transistor which variation is caused by the mask resolution and due to the variation of a semiconductor characteristic (a resistivity) in a direction parallel to a surface of a semiconductor chip which variation is caused by irregularities in a diffusion process, the electrical characteristic of each transistor is varied.

It has been known that the above variation caused by the mask resolution can be reduced by increasing the size of each transistor in a direction parallel to the surface of the semiconductor chip. It has been also known that the above variation caused by the irregularities in the diffusion process can be reduced by forming the differential pair transistors as shown in FIGS. 2A and 2B.

Figure 2A:
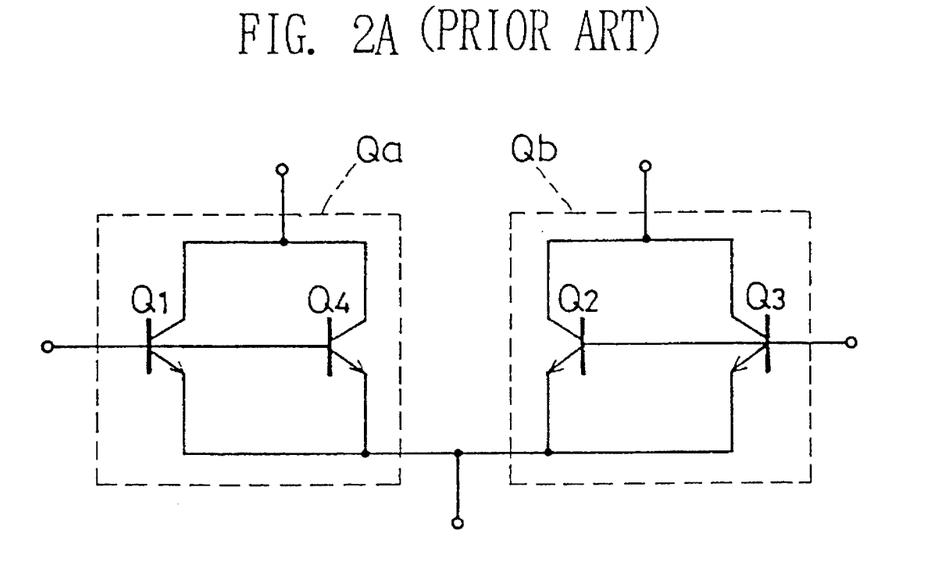
FIG. 2A is an equivalent circuit diagram illustrating a conventional differential pair transistors included in the differential amplifier shown in FIG. 1.

Referring to FIG. 2A, each of the differential pair transistors Qa and Qb is formed of two transistor elements. That is, a first transistor Qa out of the differential pair transistors Qa and Qb is formed of transistor elements Q1 and Q4 which are connected to each other in parallel and a second transistor Qb out of the differential pair transistors Qa and Qb is formed of transistor elements Q2 and Q3 which are connected to each other in parallel. The above four transistors Q1, Q2, Q3 and Q4 are formed on a semiconductor chip so as to be arranged as shown in FIG. 2B. This arrangement of the transistors Q1, Q2, Q3 and Q4 are often referred to as a common-centroid layout. Referring to FIG. 2B, the transistor elements Q1 and Q4 forming the first transistor Qa are arranged on a semiconductor chip so as to be symmetrical about a center point O, and the transistor elements Q2 and Q3 forming the second transistor Qb are arranged on the semiconductor chip, in a direction perpendicular to a direction in which the transistor elements Q1 and Q4 are arranged, so as to be symmetrical about the center point O. Furthermore, the transistor elements Qt and Q2 are symmetrical about a y-axis, the transistors Q3 and Q4 are symmetrical about the y-axis, the transistors Q1 and Q3 are symmetrical about an x-axis perpendicular to the y-axis, and the transistors Q2 and Q4 are symmetrical about the x-axis.

Figure 2B:
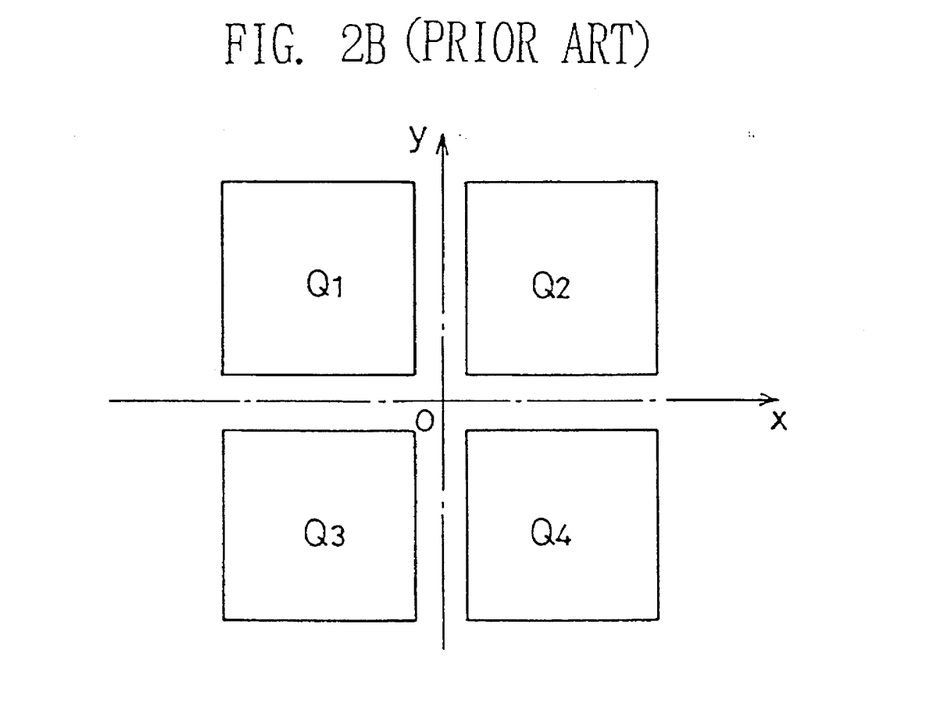
FIG. 2B is a diagram illustrating the arrangement of transistor elements forming the conventional differential pair transistors on a semiconductor chip.

In the differential pair transistors Qa and Qb having the above construction in accordance with the common-centroid layout as shown in FIG. 2B, the location of the transistor element Q1 is the same as those of the transistor elements Q2 and Q3 respectively in directions of the y-axis and the x-axis, and the location of the transistor element Q4 is the same as those of the transistor elements Q2 and Q3 respectively in directions of the x-axis and the y-axis. Thus, even if the semiconductor chip has the gradient of the resistivity in a direction parallel to the x-axis, the electrical characteristics of the transistor elements Q1 and Q4 are respectively similar to those of the transistors Q3 and Q2. In addition, even if the semiconductor chip has the gradient of the resistivity in a direction parallel to the y-axis, the electrical characteristics of the transistor elements Q1 and Q4 are respectively similar to those of the transistors Q2 and Q3. As a result, even if the semiconductor chip has the gradient of the resistivity in any direction, the electric characteristic of the first transistor Qa formed of the transistors Q1 and Q4 is similar to that of the second transistor Qb formed of the transistors Q2 and Q3.

However, the equality of the differential transistors Qa and Qb in the electric characteristic is not sufficient to further reduce the offset voltage in the differential amplifier 1.

SUMMARY OF THE INVENTION

Accordingly, a general object of the present invention is to provide a novel and useful semiconductor device having a pair of transistors which should have the same electrical characteristic, in which semiconductor device the disadvantages of the aforementioned prior art are eliminated.

A more specific object of the present invention is to provide a semiconductor device having a pair of transistors in which the equality thereof in the electrical characteristic can be improved.

The above objects of the present invention are achieved by a semiconductor device comprising: plurality of groups of transistor elements which are formed on a single semiconductor chip, each group having a first pair of transistor elements which are arranged so as to be symmetrical about a point and a second pair of transistor elements which are arranged, in a direction perpendicular to a direction in which the first pair of transistor elements are arranged, so as to be symmetrical about the point; means for connecting the first pair of transistor elements in all the plurality of groups in parallel so that a first transistor is formed of the first pair of transistor elements; and means for connecting the second pair of transistor elements in all the plurality of groups in parallel so that a second transistor is formed of the second pair of transistor elements, the first transistor and the second transistor being paired.

According to the present invention, a pair of the transistors are formed of a plurality of groups of transistor elements which are formed on a single semiconductor chip, each group having a first pair of transistor elements which are arranged so as to be symmetrical about a point and a second pair of transistor elements which are arranged in a direction perpendicular to a direction in which the first pair of transistor elements are arranged, so as to be symmetrical about the point. Thus, even if the semiconductor characteristic of the single semiconductor chip has the gradient in any direction, the equality of the transistors which are paired can be improved.

Additional objects, features and advantages of the present invention will become apparent from the following detailed description when read in conjunction with the accompanying drawings.

DESCRIPTION OF THE PREFERRED EMBODIMENTS

It has been experimentally known that the electrical characteristics of elements, such as transistors, which are formed close to each other on a semiconductor chip are in a normal distribution. Assuming that the standard deviation of the normal distribution of electric characteristics of the elements close to each other on the semiconductor chip and a center value in the normal distribution are respectively represented by $\sigma_{0i}$ and $X_o$, the standard deviation $\sigma$ of a distribution of electrical characteristics of groups of elements, each group having n elements connected to each other in parallel is represented by $$\sigma = \sigma_0/\sqrt{n}.$$

Thus, the larger the number (n) of elements included in each group, the smaller the standard deviation $\sigma$. That is, the variation of the electrical characteristics of the groups of elements formed on the semiconductor chip can be reduced. The present invention is based on the above viewpoint.

A description will now be given, with reference to FIGS. 3A, 3B and 4, of an embodiment of the present invention.

Figure 3A:
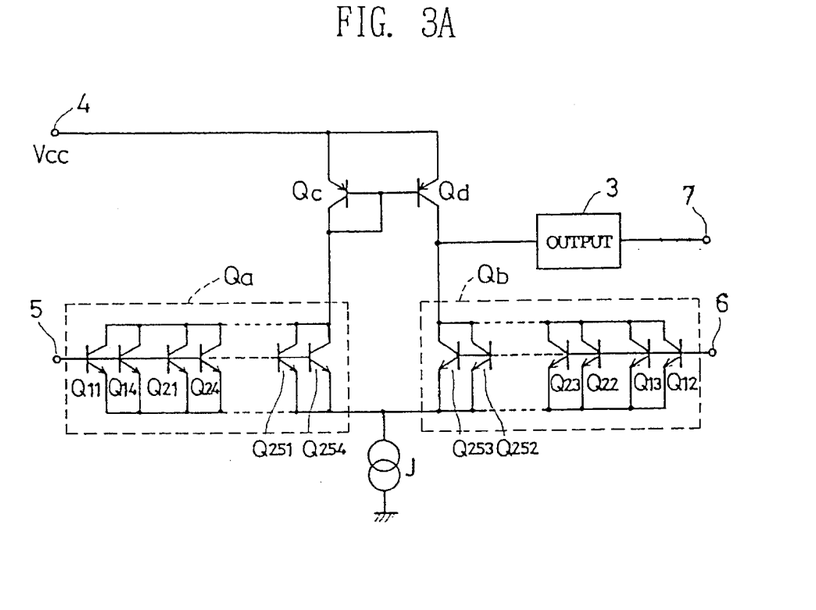
FIG. 3A is an equivalent circuit diagram illustrating a differential amplifier having a pair of transistors according to an embodiment of the present invention.

In FIG. 3A, which shows a differential amplifier, those parts which are the same as those shown in FIG. 1 are given the same reference numbers. Referring to FIG. 3A, the differential amplifier has the differential pair transistors Qa and Qb respectively coupled to the input terminals 5 and 6, the current mirror transistors Qc and Qd coupled to the power source terminal 4 and the output stage 3 coupled to the output terminal 7 all of which are connected to each other in the same manner as those in the conventional differential amplifier shown in FIG. 1. The first transistor Qa from the differential pair transistors Qa and Qb has fifty transistor elements Q11, Q14, Q21, Q24, . . . , Q251 and Q254 which are connected to each other in parallel. The second transistor Qb from the differential pair transistors Qa and Qb has also fifty transistor elements Q12, Q13, Q22, Q23, . . . , Q252 and Q253 which are connected to each other in parallel.

Figure 3B:
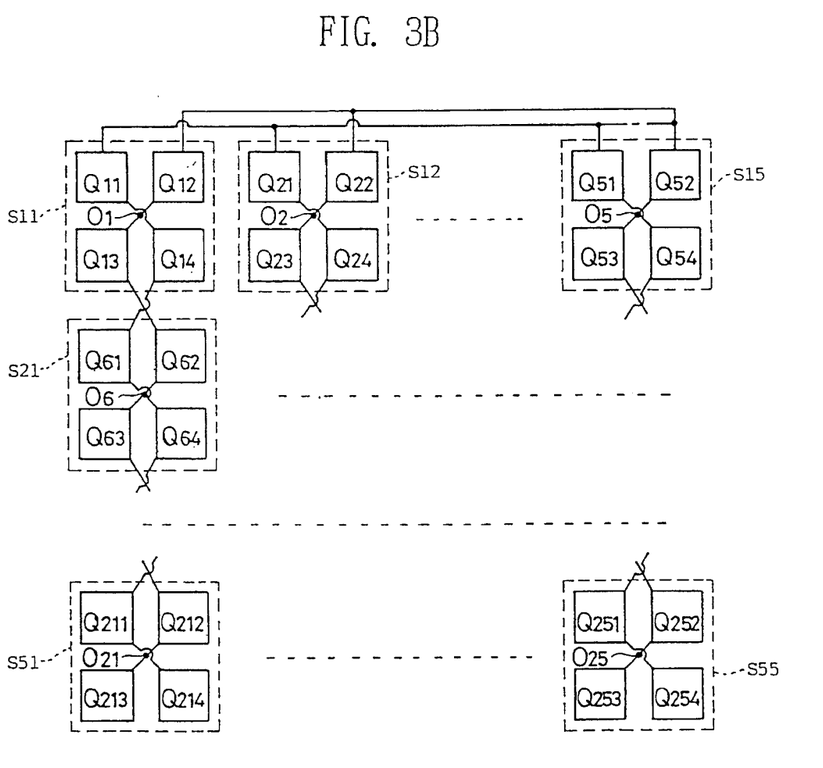
FIG. 3B is a diagram illustrating a structure of the pair of transistors shown in FIG. 3A.

All the transistor elements forming the differential pair transistors Qa and Qb are formed on a single semiconductor chip so as to be arranged and connected to each other as shown in FIG. 3B. Referring to FIG. 3B, twenty five transistor areas Sjk (j=1,2, . . . and 5, and k=1,2, . . . and 5) are arranged in a 5×5 matrix on the semiconductor device. Each of the transistor areas Sjk imaginarily has a center point Oi positioned at the center thereof. On each of the twenty five transistor areas Sjk, four transistor elements Qi1, Qi2, Qi3 and Qi4 are formed so as to be arranged in accordance with the common-centroid layout as described above. That is, on each of the transistor areas Sjk, two transistor elements Qi1 and Qi4 included in the first transistor Qa from the differential pair transistor Qa and Qb are arranged so as to be symmetrical about the center point Oi, and other two transistor elements Qi2 and Qi3 included in the second transistor Qb are arranged, in a direction perpendicular to a direction in which the above two transistor elements Qi1 and Qi4 are arranged, so as to be symmetrical about the center point Oi. The transistor elements Qi1 and Qi4 (the subscript number i is varied from 1 to 25) on the respective transistor areas Sjk (the subscript numbers j and k are respectively varied from 1 to 5) are connected in parallel, and the transistor elements Qi2 and Qi3 on the respective transistor areas Sjk are connected in parallel.

Figure 4:
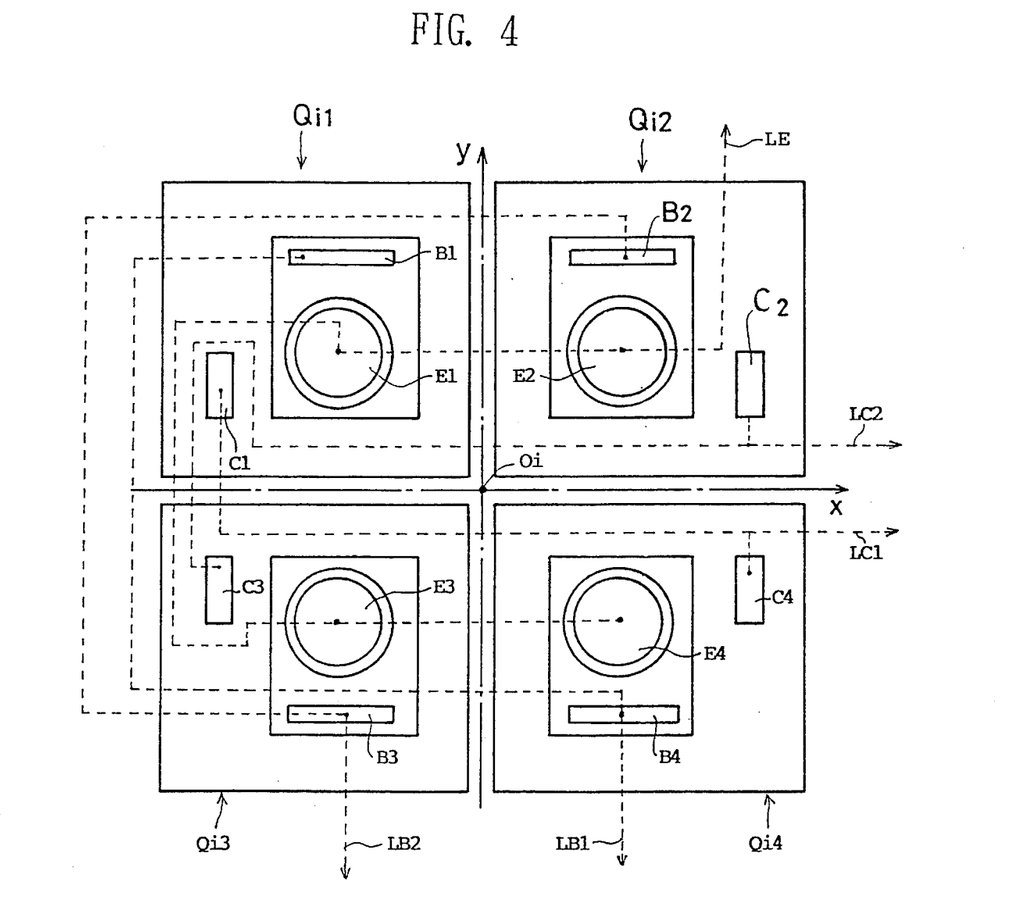
FIG. 4 is a diagram illustrating the arrangement of transistor elements forming each of sets of transistor elements shown in FIG. 3B.

Detailed arrangement and connection of the four transistor elements Qi1, Qi2, Qi3 and Qi4 on each of the transistor areas Sjk are shown in FIG. 4. Referring to FIG. 4, the transistor elements Qi1, Qi2, Qi3 and Qi4 respectively have emitter areas E1, E2, E3 and E4, collector areas C1, C2, C3 and C4 and base areas B1, B2, B3 and B4. On the transistor elements Qi1 and Qi4 which are arranged so as to be symmetrical about the center point Oi, the emitter area E1, the collector area C1 and the base areas B1 are respectively symmetrical to the emitter area E4, the collector area C4 and the base area B4 about the center point Oi. In addition, on the transistor elements Qi2 and Qi3 which are arranged so as to be symmetrical about the center point Oi, the emitter area E2, the collector area C2 and the base area B2 are respectively symmetrical to the emitter area E3, the collector area C3 and the base area B3 about the center point Oi. The transistor elements Qi1 and Qi4 are respectively symmetrical to the transistor elements Qi3 and Qi2 about the x-axis, and are respectively symmetrical to the transistor elements Qi2 and Qi3 about the y-axis.

The transistor elements Qi1, Qi2, Qi3 and Qi4 are connected to each other as shown by dotted lines in FIG. 4. That is, the emitter areas E1, E2, E3 and E4 of all the transistor elements Qi1, Qi2, Qi3 and Qi4 are connected by a line $L_E$, the collector areas C1 and C4 of the transistor elements Qi1 and Qi4 are connected by a line $L_{C1}$, the collector areas C2 and C3 of the transistor elements Qi2 and Qi3 are connected by a line $L_{C2}$ to each other, the base areas B1 and B4 of the transistor elements Qi1 and Qi4 are connected by a line $L_{B1}$, and the base areas B2 and B3 of the transistor elements Qi2 and Qi3 are connected by a line $L_{B2}$. Lines $L_E$ of all the transistor areas are connected to each other and to the constant power source J. Lines $L_{C1}$ of all the transistor areas are connected to each other and to the collector of the transistor Qc, and lines $L_{C2}$ of all the transistor areas are connected to each other and to the collector of the transistor Qd. Furthermore, lines $L_{B1}$ of all the transistor areas are connected to each other and to the input terminal 5, and lines $L_{b2}$ of all the transistor areas are connected to each other and to the input terminal 6. As a result, the transistor elements Q11, Q14, Q21, Q24, . . . , Q251 and Q254 forming the first transistor Qa and the transistor elements Q12, Q13, Q22, Q23, . . . , Q252 and Q253 forming the second transistor Qb are connected as shown in FIGS. 3A and 3B.

In FIG. 3B, continuous lines coupling transistor elements indicates that the transistor elements are connected in parallel, and a chain line indicates that emitters of the transistor elements forming the first transistor Qa are connected to emitters of the transistor elements forming the second transistor Qb.

According to the above embodiment of the present invention, in each of the transistor areas Sjk, even if the semiconductor chip (a semiconductor substrate) has the gradient of the resistivity in any direction, the electric characteristics of the differential pair transistor are substantially equal to each other. In addition, since each of the differential pair transistors Qa and Qb is formed of twenty five pairs of transistor elements connected in parallel, the distribution of the electrical characteristics of the differential pair transistors formed on the single semiconductor chip has the standard deviation $\sigma_{25}$:

$$\sigma_{25} = \sigma_0/\sqrt{n} = \sigma_0/5.$$

That is, the variation (the standard deviation of the distribution) of the electric characteristics of the differential pair transistors formed on the single semiconductor chip is reduced to a value which is one fifth of the conventional value.

Thus, the equality of the forward drop characteristics a $h_{FE}$ characteristic and other electrical characteristics of the differential pair transistors Qa and Qb can be improved, so that the DC offset voltage of the differential amplifier can be further reduced.

In the above embodiment, the transistor areas Sjk, on each of which four transistor elements are formed in accordance with the common-centroid layout, may be arranged in mosaic instead of in the matrix.

A description will now be given, with reference to FIG. 5, of another embodiment of the present invention.

Figure 5:
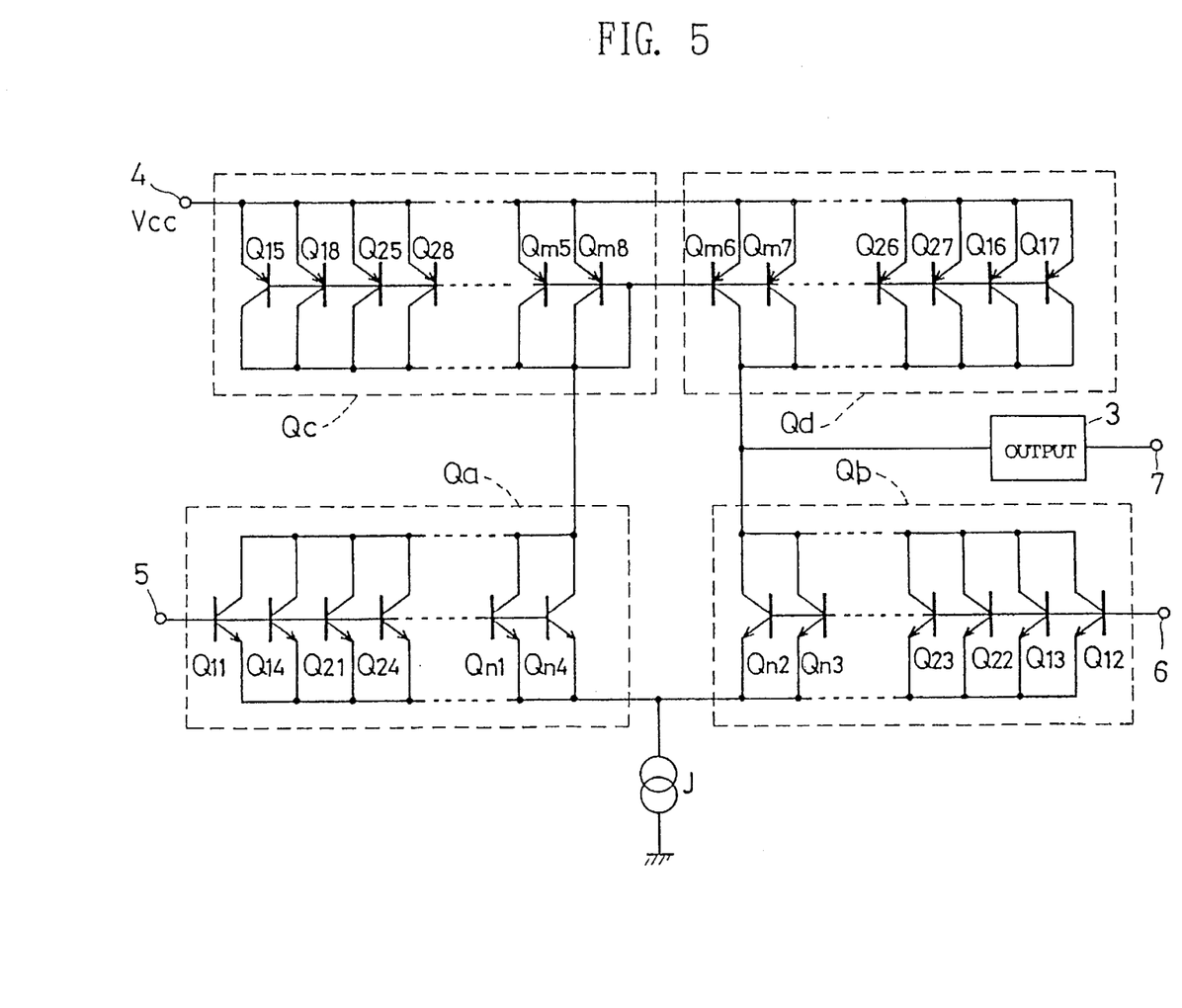
FIG. 5 is an equivalent circuit diagram of another embodiment of the present invention.

FIG. 5 shows a differential amplifier having the differential pair transistors Qa and Qb, the current mirror transistors Qc and Qd, the constant power source J and the output stage 3 in the same manner as that shown in FIGS. 1 and 3A. In this embodiment, the differential transistors Qa and Qb are respectively formed of a group of transistor elements Q11, Q14, Q21, Q24, . . . , Qn1 and Qn4 connected to each other in parallel and a group of transistor elements Q12, Q13, Q22, Q23, . . . , Qn2 and Qn3, in the same manner as that shown in FIGS. 3A and 3B. Furthermore, the current mirror transistors Qc and Qd are respectively formed of a group of transistor elements Q15, Q18, Q25, Q28, . . . , Qm5 and Qm8 connected to each other in parallel and a group of transistor elements Q16, Q17, Q26, Q27, . . . , Qm6 and Qm7.

The transistor elements forming the current mirror transistors Qc and Qd are formed on a single semiconductor chip. On the single semiconductor chip, m transistor areas are arranged in a matrix or in a mosaic, and in each transistor area, transistor elements Qi5, Qi6, Qi7 and Qi8 (i=1, 2, . . . , and m) are arranged so that the transistor elements Qi5 and Qi8 are symmetrical about a center point Oi and the transistor elements Qi6 and Qi7 are arranged, in a direction perpendicular to a direction in which the above transistor elements Qi5 and Qi8 are arranged, so as to be symmetrical about the center point Oi, as shown in FIG. 4.

According to this embodiment, the variation of the electric characteristics of the current mirror transistors Qc and Qd can be reduced, so that a desired current ratio can be obtained in collectors of the current mirror transistors Qc and Qd. Thus, a characteristic of the differential amplifier can be further improved.

Figure 6:
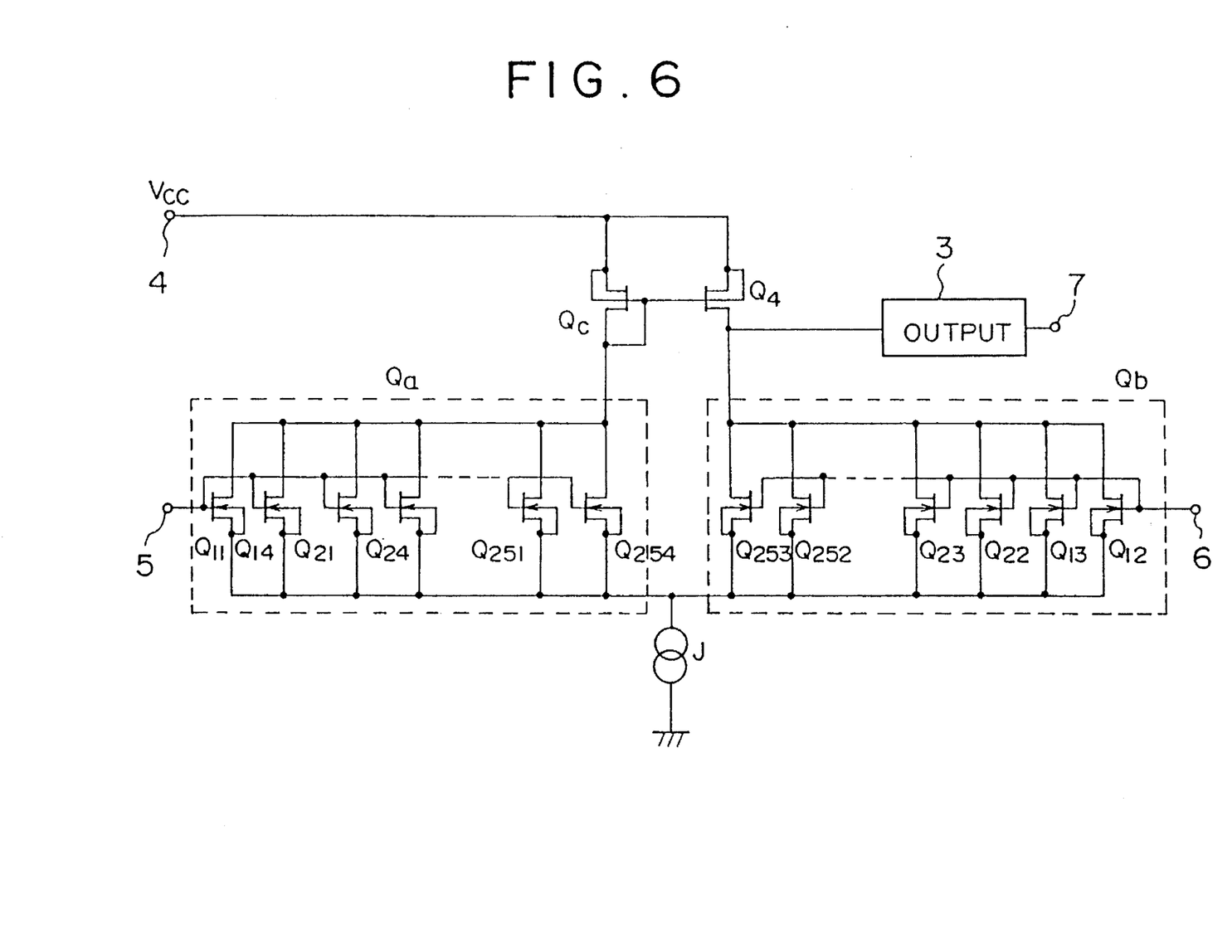
FIG. 6 is an equivalent circuit diagram illustrating a differential amplifier formed of MOS transistor elements.

In the above embodiment, the numbers n and m can be respectively set at values in accordance with desired electrical characteristic of the differential amplifier. In addition, the differential pair transistors Qa and Qb and the current mirror transistors Qc and Qd may be also formed of MOS transistor elements instead of bipolar transistor elements. In this case, the gate, source and drain respectively correspond to the base, emitter and collector. In general, the offset voltage of the differential amplifier formed of the MOS transistors is greater than that of the differential amplifier formed of the bipolar transistors. Thus, the present invention is effective in the differential amplifier formed of the MOS transistors. The differential amplifier is formed of the MOS transistor elements, for example, as shown in FIG. 6.

Furthermore, the transistors in semiconductor device may be multiemitter transistors, multicollector transistors, multisource transistors, or multidrain transistors.

The present invention is not limited to the aforementioned embodiments, and variations and modifications may be made without departing from the scope of the claimed invention.

What is claimed is:

1. A semiconductor device comprising:

a plurality of groups of transistor elements which are formed on a single semiconductor chip in a matrix of rows and columns, each group having a first pair of transistor elements which are arranged so as to be symmetrical about a point and a second pair of transistor elements which are arranged, in a direction perpendicular to a direction in which said first pair of transistor elements are arranged, so as to be symmetrical about the point;

means for connecting said first pair of transistor elements in all said plurality of groups in parallel so that a first transistor for said device is formed of said first pairs of transistor elements such that no two parallel connected transistor elements are in juxtaposition; and means for connecting said second pair of transistor elements in all said plurality of groups in parallel so that a second transistor for said device is formed of said second pairs of transistor elements such that no two parallel connected transistor elements are in juxtaposition, said first transistor and said second transistor being connected to form a transistor pair.

2. The semiconductor device as claimed in claim 1, wherein said semiconductor device is a differential amplifier having differential input transistors formed of said first transistor and said second transistor.

3. The semiconductor device as claimed in claim 1, wherein said semiconductor device is a differential amplifier having differential input transistors and a current mirror circuit formed of said first transistor and said second transistor, said current mirror circuit being connected to said differential transistors as a load thereof.

4. The semiconductor device as claimed in claim 1, wherein each of said transistor elements is a bipolar transistor.

5. The semiconductor device as claimed in claim 1, wherein each of said transistor elements is a MOS transistor.

6. The semiconductor device as claimed in claim 2, wherein said semiconductor device is a differential amplifier having a current mirror circuit connected to said differential input transistors, and wherein said current mirror circuit is formed of second and third transistors formed of a plurality of groups of transistor elements in the same manner as said first and second transistors.

* * * * *